(12) United States Patent
Liu et al.

(10) Patent No.: US 7,670,028 B2
(45) Date of Patent: Mar. 2, 2010

(54) LED LAMP WITH A HEAT SINK

(75) Inventors: Jun Liu, Shenzhen (CN); Yong-Dong Chen, Shenzhen (CN); Shih-Hsun Wung, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/024,963

(22) Filed: Feb. 1, 2008

(65) Prior Publication Data
US 2009/0147520 A1 Jun. 11, 2009

(30) Foreign Application Priority Data
Dec. 7, 2007 (CN) .......................... 2007 1 0124919

(51) Int. Cl.
*F21V 29/00* (2006.01)
(52) U.S. Cl. .................. 362/294; 362/96; 362/234; 362/373; 362/800
(58) Field of Classification Search .................. 362/96, 362/234, 294, 373, 800
See application file for complete search history.

(56) References Cited

U.S. PATENT DOCUMENTS

| 7,144,140 | B2 * | 12/2006 | Sun et al. ..................... 362/373 |
| 2005/0174780 | A1 * | 8/2005 | Park ........................... 362/294 |
| 2006/0032610 | A1 * | 2/2006 | Zhong et al. ................ 165/80.3 |
| 2007/0236935 | A1 * | 10/2007 | Wang ........................ 362/294 |

FOREIGN PATENT DOCUMENTS

| CN | 1949958 A | 4/2007 |
| CN | 200940796 Y | 8/2007 |

* cited by examiner

*Primary Examiner*—Sandra L O'Shea
*Assistant Examiner*—Meghan K Dunwiddie
(74) *Attorney, Agent, or Firm*—Frank R. Niranjan

(57) ABSTRACT

An LED lamp includes a post (10), a heat sink (20) enclosing the post, an LED module (30) mounted on the post, a holder (40) secured on the LED module, and a lens (50) covering the holder. The heat sink is formed by a plurality of separated fins assembled together. Each fin comprises an outer portion (22) and an inner portion (24). An inner edge of the outer portion abuts interferingly against a periphery of the post, and a bottom of the inner portion contacts a top surface of the post. Heat generated by the LED module is conducted through the post to the plurality of fins, which dissipate the heat to the ambient air.

17 Claims, 4 Drawing Sheets

LED LAMP WITH A HEAT SINK

BACKGROUND OF THE INVENTION

1. Field of the Invention

The present invention relates to a light emitting diode (LED) lamp, and more particularly to an LED lamp incorporating a heat sink for increasing a heat dissipation thereof.

2. Description of Related Art

As an energy-efficient light, an LED lamp has a trend of substituting for the fluorescent lamp for an indoor lighting purpose; in order to increase the overall lighting brightness, a plurality of LEDs are often incorporated into a signal lamp, in which how to efficiently dissipate heat generated by the plurality of LEDs becomes a challenge.

Conventionally, an LED lamp comprises a cylindrical enclosure and a plurality of LEDs mounted on the enclosure. The plurality of LEDs may be arranged in a plurality of lines along a height direction of the enclosure and around lateral sides of the enclosure, or just radially mounted on a top face of the enclosure. When the plurality of LEDs are activated to lighten, heat generated by the plurality of LEDs is dispersed to ambient air via the enclosure by natural air convection.

However, in order to achieve a compact design and facilitate a transportation and handling of the LED lamp, the LED lamp is made having a small size, whereby the enclosure also has a small size, which leads to a limited heat dissipating area of the enclosure. The limited heat dissipating area makes the enclosure have a lower heat dissipating capability and may cause the LEDs to overheat, whereby the LEDs will operate unstably or even fail.

What is needed, therefore, is an LED lamp with a heat sink which can overcome the above-mentioned disadvantages.

SUMMARY OF THE INVENTION

An LED lamp includes a post, a heat sink enclosing the post, an LED module mounted on the post, a holder secured on the LED module, and a lens covering the holder. The heat sink is formed by a plurality of fins, each comprising an outer portion and an inner portion. A lower part of the outer portion has an inner edge abutting interferingly against a circumferential periphery of the post, and the inner portion has a bottom engaging a top surface of the post. Heat generated by an LED of the LED module can be conducted through the post to the plurality of fins, which dissipate the heat to the ambient air sufficiently with its large heat dissipating area. Therefore, the LED lamp can be made having a small size meanwhile with a high dissipating efficiency.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
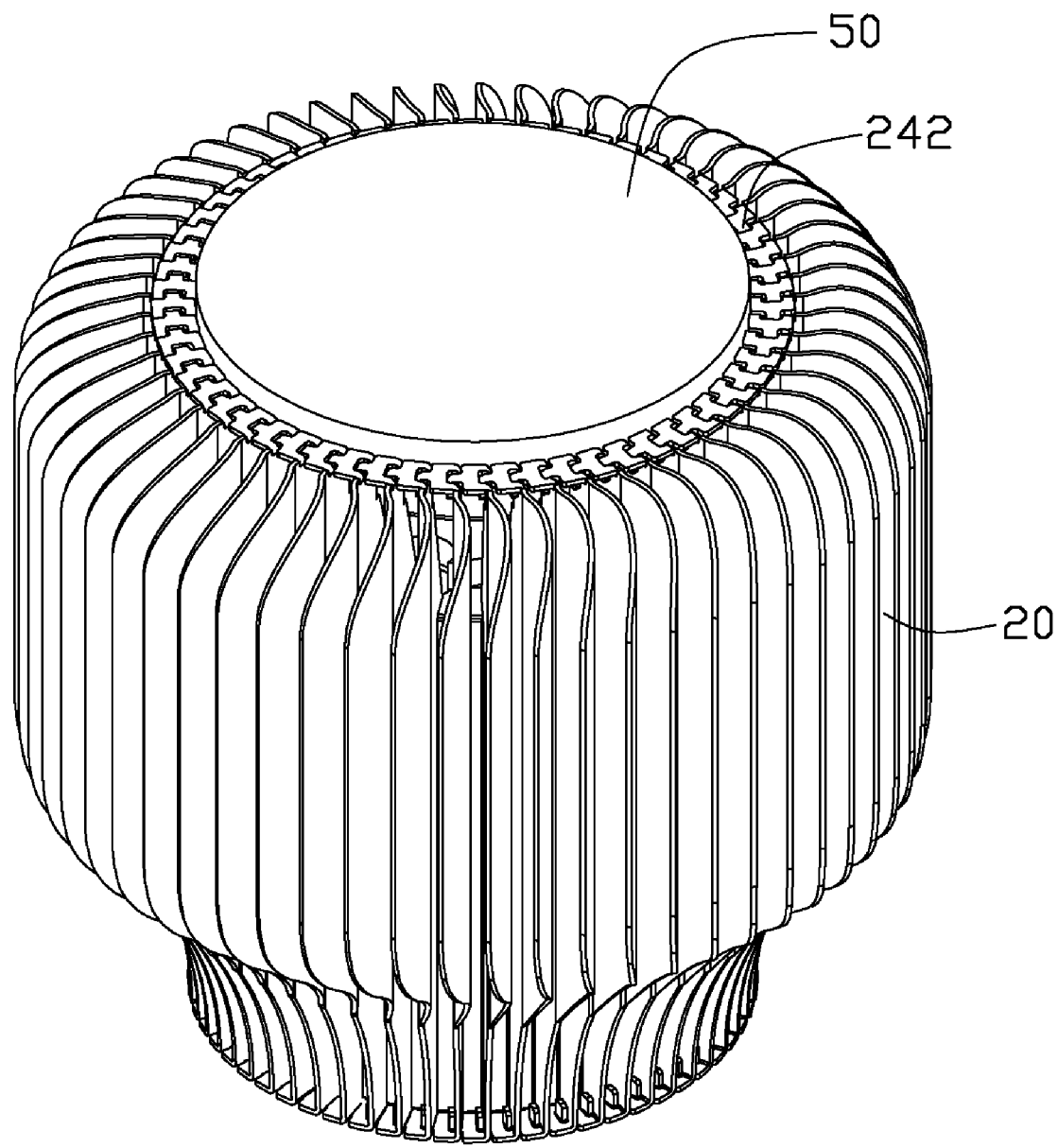
FIG. 1 is an assembled, isometric view of an LED lamp with a heat sink in accordance with a preferred embodiment of the present invention.
Figure 2:
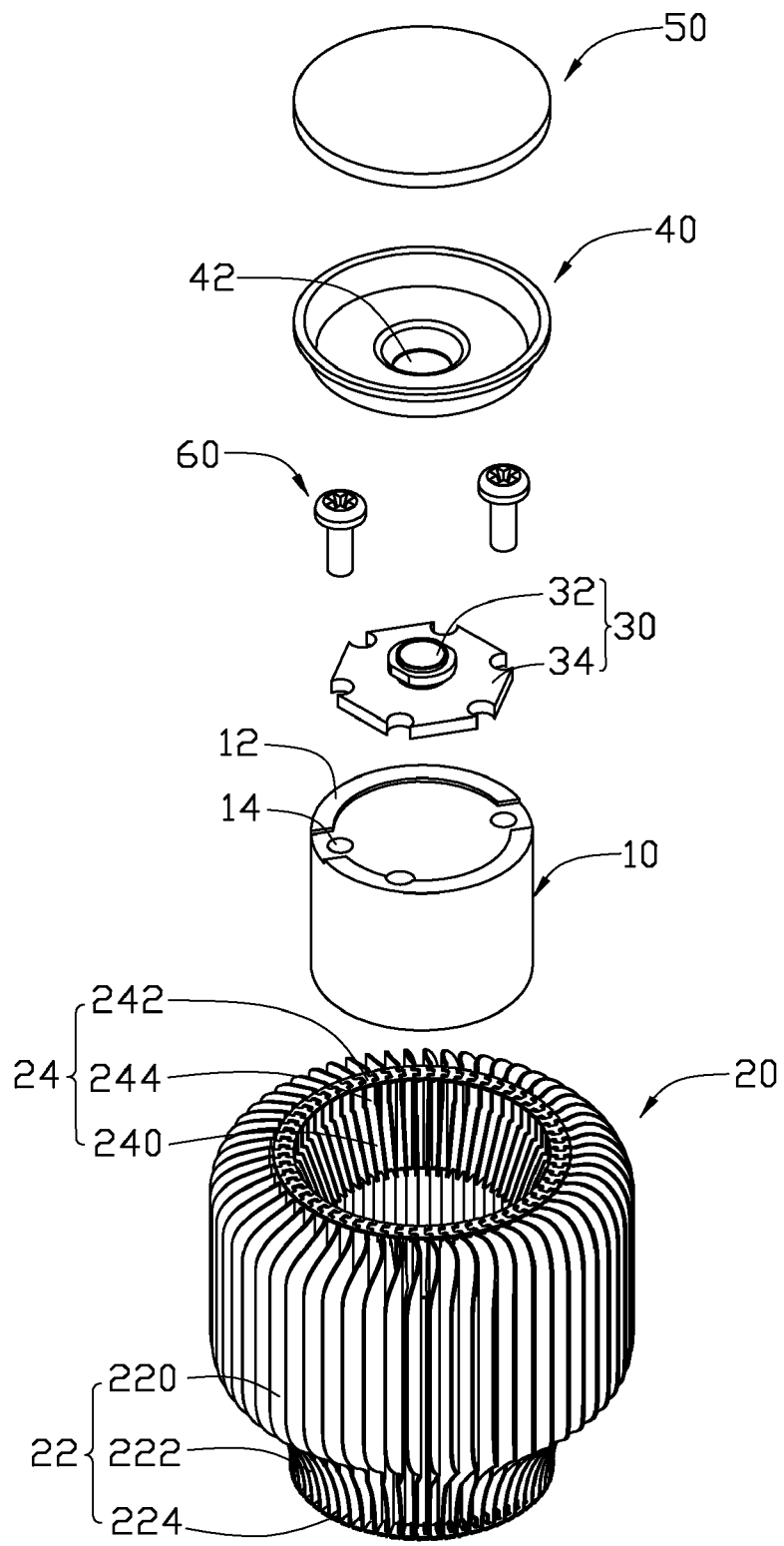
FIG. 2 is an exploded view of FIG. 1.

Referring to FIGS. 1 and 2, an LED lamp in accordance with a preferred embodiment of the present invention comprises a post 10, a heat sink 20 mounted around the post 10, an LED module 30 resting on the post 10, a holder 40 fixed on the LED module 30, and a lens 50 retained on the heat sink 20 and covering the holder 40.

The post 10 has a solid, cylindrical configuration and is made of metal having good heat conduction, such as copper, aluminum, or an alloy thereof. Alternatively, the post 10 can also be made hollow with a kind of coolant (not shown) received therein, for achieving a better heat dissipation. The post 10 forms a pair of symmetrical strips 12 on a top face (not labeled) thereof, wherein each of the pair of strips 12 is arc-shaped and curved outwardly, with an outer rim coincidental with a part of a periphery of the top face of the post 10. A gap (not labeled) is defined between two neighboring ends of the pair of strips 12. A pair of holes 14 are defined at the top face of the post 10 and located corresponding to the gaps, respectively, for threadedly receiving screws 60 therein.

Figure 3:
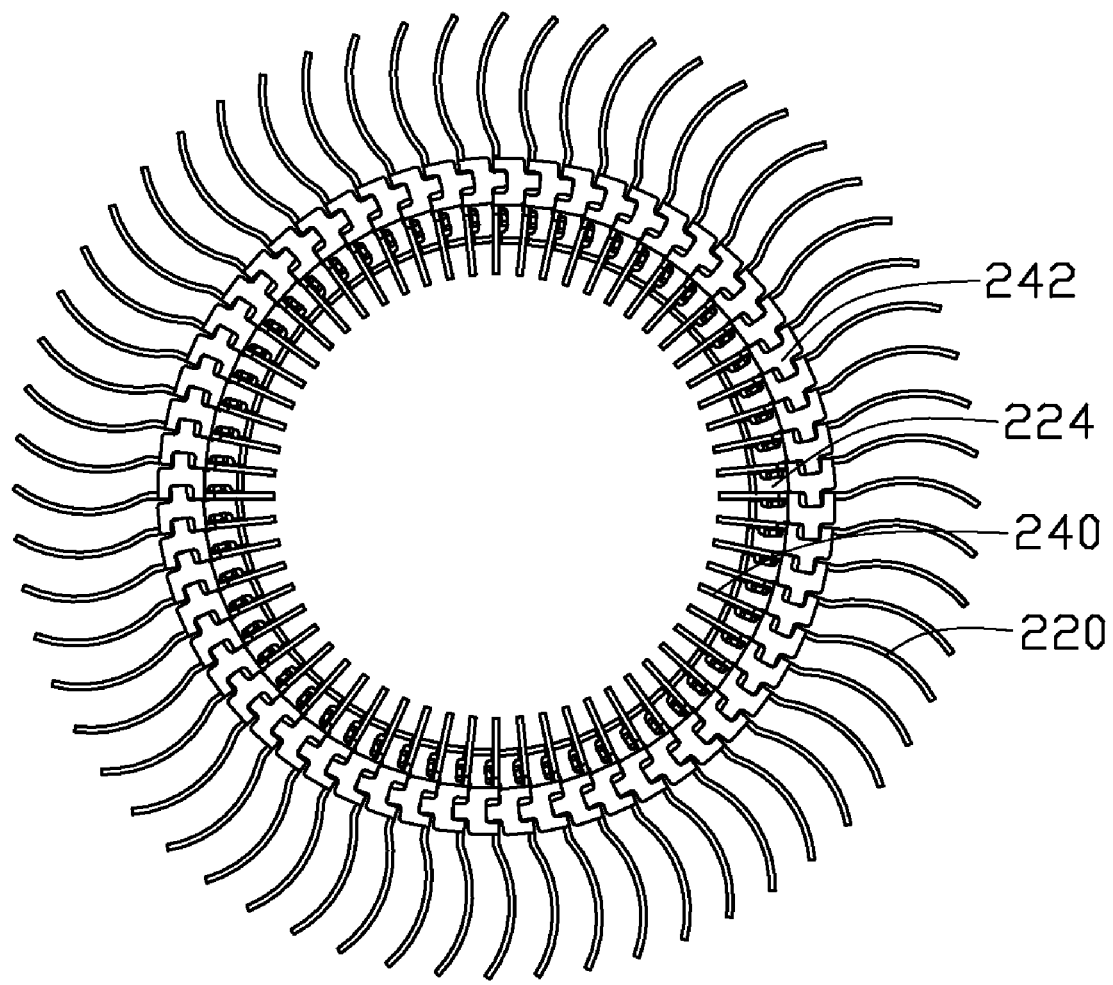
FIG. 3 is a top view of the heat sink of FIG. 1.

Also referring to FIG. 3, the heat sink 20 is constructed by a plurality of fins (not labeled) connecting with each other. Each of the plurality of fins consists of an outer portion 22 and an inner portion 24 formed inwardly from the outer portion 22. The outer portion 22 comprises a lower part 222 having a radial length gradually increasing upwardly, and an outer tab 220 extending upwardly from a top of the lower part 222 and curved along a clockwise direction as viewed from FIG. 3. The outer tab 220 of the outer portion 22 is radially longer than the lower part 222, for increasing a heat dissipating area of the heat sink 20 as large as possible. A lower flange 224 extends horizontally and circumferentially from a bottom of the lower part 222, and is locked with another lower flange 224 formed on an adjacent lower part 222 to form an annular junction (not labeled), thereby connecting bottoms of the plurality of fins, and enabling the heat sink 20 to be integral.

The inner portion 24 of each of the plurality of fins includes an upper flange 242 extending inwardly and horizontally from a top of the outer portion 22, and an upper part 240 extending inwardly from an upper portion of the outer portion 22, and an inner tab 244 coupling the upper flange 242 with the upper part 240. Each upper flange 242 engages with an adjacent upper flange 242 to construct an annular joint (not labeled), so as to interconnect tops of the plurality of fins, and further reinforce the integral heat sink 20. The annular joint formed by the upper flanges 242 surrounds the annular junction formed by the lower flanges 224 as illustrated in FIG. 3, since a diameter of the annular joint is larger than that of the annular junction. The inner tab 244 of the inner portion 24 has an upright edge extending downwardly from an inner periphery of the upper flange 242, and the upper part 240 has an inclined edge extending inwardly and downwardly from the upright edge of the inner tab 244, which means that the inner tab 244 is configured to be rectangular, and the upper part 240 is shaped to be trapezoid. In other words, a width of the inner tab 244 is the same as that of the upper flange 242 and smaller than that of a bottom of the upper part 240.

When the post 10 is fitted into the heat sink 20, it is located below the inner portions 24 of the plurality of fins. The bottoms of the upper parts 240 of the inner portions 24 engage the top face of the post 10. A lower potion of the post 10 interferingly engages the lower parts 222 of the outer portions 22 of the plurality of fins. An upper portion of the post 10 is spaced from middle parts (not labeled) of the plurality of fins, which are located between the upper parts 240 and the lower parts 222 of the plurality of fins of the heat sink 20.

Figure 4:
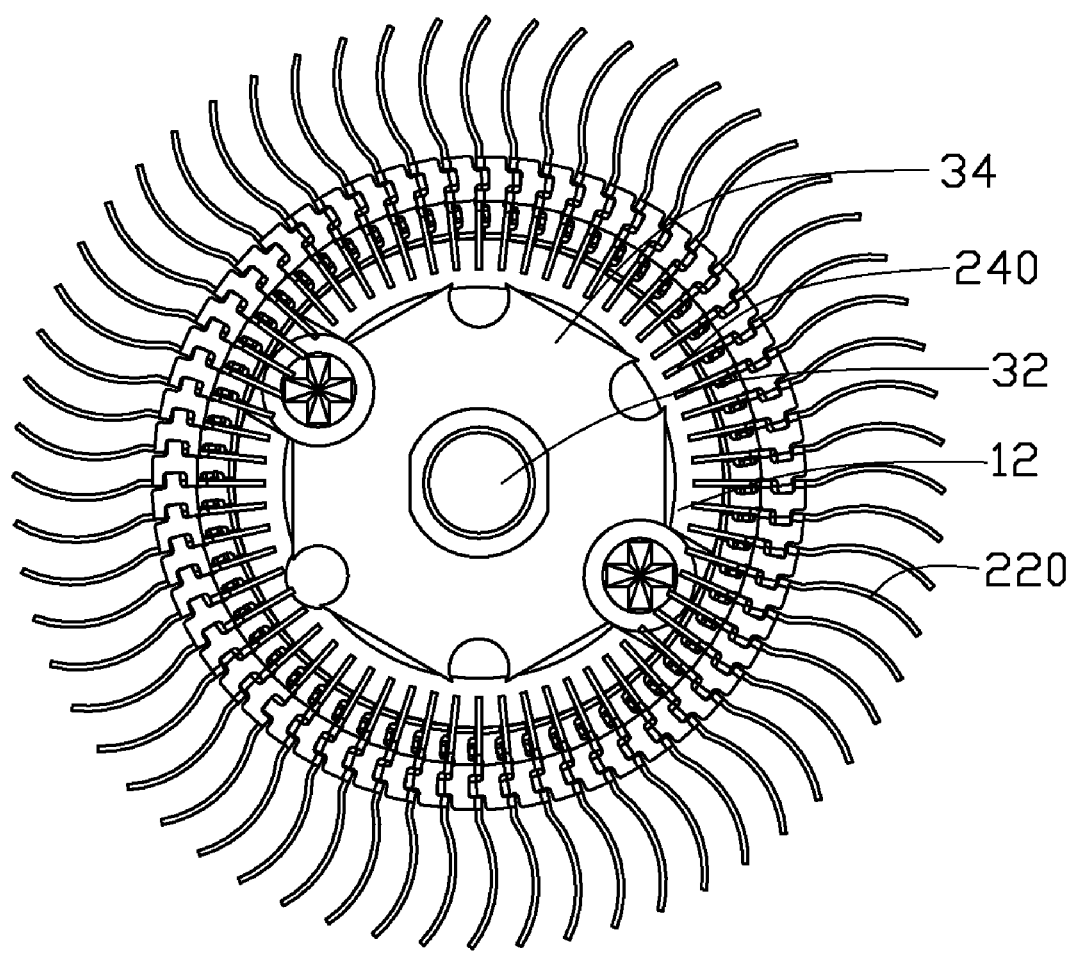
FIG. 4 is a top view of the LED lamp of FIG. 1, with a lens and a holder of the LED lamp being removed for clarity.

As shown in FIGS. 1-2 and 4, the LED module 30 comprises a printed circuit board 34 having a floral shape, and an LED 32 mounted on a center of the printed circuit board 34. The LED module 30 is fixed on the top face of the post 10 and surrounded by the pair of strips 12 as viewed from FIG. 4, by extension of the screws 60 through the printed circuit board 34 to engage in the pair of holes 14 of the post 10; thus, when the LED 32 is activated to lighten, heat generated by the LED 32 is conducted to the post 10 via the printed circuit board 34, and then transferred to the heat sink 20, which disperses the heat to an ambient air.

The holder 40 is disposed on the LED module 30 and enclosed by the inner portions 24 of the plurality of fins of the heat sink 20. The holder 40 defines a hole 42 in a center thereof for exposing the LED 32 therein, whereby a part of light emitted from the LED 32 is able to directly transfer through the hole 42, and remaining part of light would be reflected by inner surfaces of the holder 40 defining the hole 42 and then combine with the part of light to thereby together project to a surrounding environment.

The lens 50 is secured on the holder 40 and has an upper portion located beyond the upper flanges 242 of the heat sink 20 as shown in FIG. 1. The lens 50 is used for concentrating the light produced by the LED 32 into a light beam, whereby the LED lamp can project the light with sufficient intensity.

Since the plurality of fins formed around and contacting the post 10 provides enough heat dissipating areas to the LED lamp, the heat generated by the LED 32 can be facilitated to be dissipated to the ambient air via the plurality of fins much more rapidly and sufficiently, thus preventing the LED 32 from overheating or malfunctioning. Therefore, the post 10 needs not to be made having a large size to obtain a large heat dissipating area, and the LED lamp can thus be handled or transported conveniently.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp comprising:
a post;
an LED module mounted on a top face of the post; and
a heat sink surrounding the post, consisting of a plurality of separated fins assembled together, each of the plurality of fins comprising a lower part interferentially engaging with the post, an upper part contacting the top face of the post and a middle part spaced a distance from the post; wherein the upper part is protruded inwardly towards the LED module with a bottom of the upper part abutting against the top face of the post.

2. The LED lamp as claimed in claim 1, wherein the post forms a pair of arc-shaped strips on the top face thereof, the pair of curved strips each having an outer rim being coincidental with a periphery of the top face of the post and surrounding the LED module.

3. The LED lamp as claimed in claim 1, wherein the post has a cylindrical configuration.

4. The LED lamp as claimed in claim 3, wherein the each of the plurality of fins comprises an outer portion and an inner portion extending inwardly from the outer portion, the lower part of the each of the plurality of fins being a part of the outer portion, and the upper part of the each of the plurality of fins being a part of the inner portion.

5. The LED lamp as claimed in claim 4, wherein the outer portion of the each of the plurality of fins comprises an outer tab extending upwardly from the lower part, the outer tab having a radial length larger than that of the lower part.

6. The LED lamp as claimed in claim 5, wherein the lower part of the each of the plurality of fins horizontally forms a lower flange from a bottom thereof, the lower flange being locked with an adjacent lower flange to connect the bottoms of the plurality of fins.

7. The LED lamp as claimed in claim 4, wherein the inner portion of the each of the plurality of fins comprises a horizontal upper flange formed at a top thereof, and an inner tab connecting the upper part and the upper flange, the upper flange locking with an adjacent upper flange to connect the tops of the plurality of fins.

8. The LED lamp as claimed in claim 7, wherein the inner tab of the inner portion is rectangular, and the upper part of the inner portion is trapezoid.

9. The LED lamp as claimed in claim 8, wherein the inner tab of the inner portion of the each of the plurality of fins has a width the same as that of the upper flange and smaller than that of the bottom of the upper part.

10. The LED lamp as claimed in claim 7 further comprising a holder surrounded by the inner portions of the plurality of fins, and a lens covering the holder, wherein the lens is disposed beyond the upper flanges of the heat sink.

11. A heat sink for dissipating heat generated by a heat source, comprising:
a plurality of fins each comprising a lower flange and an upper flange, the lower flanges connecting with each other to cooperatively form an annular junction, and the upper flanges coupling with each other to cooperatively form an annular joint, wherein the annular joint has a diameter larger than that of the annular junction;
wherein the annular joint surrounds the heat source.

12. The heat sink as described in claim 11, wherein the each of the plurality of fins further comprises an outer tab extending perpendicularly from the lower flange to the upper flange, the outer tab extending radially with respective to the annular joint.

13. The heat sink as described in claim 12, wherein the outer tab of the each of the plurality of fins comprises a lower part having a radial length increasing upwardly, and an upper part extending upwardly from the lower part and connecting the upper flange, the upper part being curved along a clockwise direction.

14. The heat sink as described in claim 13, wherein the each of the plurality of fins further comprises an inner tab formed inwardly from the outer tab, the inner tab coupling with and being perpendicular to the upper flange.

15. The heat sink as described in claim 14, wherein the inner tab has an upright edge extending downwardly from an inner periphery of the upper flange, and a slantwise edge extending inwardly and downwardly from the upright edge.

16. The heat sink as described in claim 15, wherein the inner tab of the each of the plurality of fins is located higher than the lower part of the outer tab.

17. The heat sink as described in claim 11, wherein the heat source is an LED.

* * * * *